(12) United States Patent
Berkel

(10) Patent No.: US 8,859,907 B2
(45) Date of Patent: Oct. 14, 2014

(54) METHOD FOR ASSEMBLING A CIRCUIT BOARD

(75) Inventor: Jan Hendrik Berkel, Rijssen (NL)

(73) Assignee: Schoeller-Electronics GmbH, Wetter/Hessen (DE)

( * ) Notice: Subject to any disclaimer, the term of this patent is extended or adjusted under 35 U.S.C. 154(b) by 257 days.

(21) Appl. No.: 13/599,984

(22) Filed: Aug. 30, 2012

(65) Prior Publication Data

US 2013/0228362 A1    Sep. 5, 2013

(30) Foreign Application Priority Data

Sep. 4, 2011    (DE) .................... 10 2011 112 090

(51) Int. Cl.
| | |
|---|---|
| H05K 1/02 | (2006.01) |
| F28F 21/00 | (2006.01) |
| H05K 3/30 | (2006.01) |
| H01L 23/367 | (2006.01) |
| H01L 23/36 | (2006.01) |
| H05K 3/00 | (2006.01) |
| H01L 23/00 | (2006.01) |
| H01L 25/065 | (2006.01) |

(52) U.S. Cl.
CPC .......... *H05K 1/0201* (2013.01); *H01L 23/3677* (2013.01); *H05K 1/0204* (2013.01); *H05K 2201/09745* (2013.01); *H01L 2224/73265* (2013.01); *H05K 3/30* (2013.01); *H05K 2201/068* (2013.01); *H01L 24/73* (2013.01); *H05K 2201/1059* (2013.01); *H05K 2201/10416* (2013.01); *H01L 2224/48472* (2013.01); *H01L 2224/32245* (2013.01); *F28F 21/00* (2013.01); *H01L 24/32* (2013.01); *H01L 23/36* (2013.01); *H01L 24/29* (2013.01); *H01L 2224/2919* (2013.01); *H01L 25/0655* (2013.01); *H01L 2224/48227* (2013.01); *H01L 24/48* (2013.01); *H05K 3/0061* (2013.01); *H05K 1/021* (2013.01)
USPC .............................. 174/252; 29/832; 165/185

(58) Field of Classification Search
CPC .......... H05K 1/02; H05K 3/30; H05K 1/021; F28F 1/00
USPC .............................. 174/252; 29/832; 165/185
See application file for complete search history.

(56) References Cited

U.S. PATENT DOCUMENTS 6,809,935 B1    10/2004   Lee

*Primary Examiner* — Timothy Thompson
*Assistant Examiner* — Charles Pizzuto
(74) *Attorney, Agent, or Firm* — Pauly, Devries Smith & Deffner, LLC

(57) ABSTRACT

Disclosed herein is a method for assembling a circuit board which has at least one layer copper clad on one or both sides or provided with conductor tracks, wherein, in one assembly step, at least one rigid flange insert is inserted into an associated recess in the circuit board or into a component associated with the circuit board and wherein at least one semiconductor die of a semiconductor component is applied onto the inserted flange insert in a subsequent application step.

20 Claims, 4 Drawing Sheets

METHOD FOR ASSEMBLING A CIRCUIT BOARD

CROSS-REFERENCE TO RELATED APPLICATIONS

This application claims the benefit of German Patent Application No. DE 10 2011 112 090.8, filed Sep. 4, 2011 in the name of Schoeller-Electronics GmbH, the disclosure of which is incorporated by reference herein in its entirety.

FIELD OF THE INVENTION

The invention relates to a method for assembling a circuit board, a circuit board and a heat sink.

BACKGROUND OF THE INVENTION

Today, a circuit board normally consists of a number of especially rigid layers of fibreglass reinforced cured epoxy resin boards which are copper clad on one or both sides or provided with conductor tracks. The circuit board is fitted with semiconductor components, with connecting elements, with elements for heat dissipation or the like. In this sense, the term "assembling" must be interpreted widely in the text which follows.

It is known to fit circuit boards with discrete semiconductor components which have a housing with contact pins. In the housing, at least one semiconductor die is located which is electrically connected to the contact pins, for example bonded.

During the ever-increasing miniaturisation in the design of circuit boards, it has also become known to apply a semiconductor die without housing directly to the circuit board in one application step. Such a semiconductor die is called a "semiconductor die". In this direct assembly, the application step is mostly followed by a bonding step in which the semiconductor die is electrically contact-connected to the circuit board.

In the known method (U.S. Pat. No. 6,809,935 B1, FIG. 1), a semiconductor die is attached directly to the metallic baseplate which provides a flat heat sink for the circuit board. This ensures good dissipation of the heat generated by the semiconductor component. It is problematic, however, that the heat expansion coefficients of the baseplate and of the semiconductor die are different from one another which must be compensated by an adhesive layer arranged between baseplate and semiconductor die. In the long term, this leads to an unwanted temperature-related mechanical loading on the semiconductor die.

SUMMARY OF THE INVENTION

The invention is based on the problem of developing the known method for assembling a circuit board in such a manner that optimum heat dissipation is possible with little temperature-related mechanical loading on the semiconductor die.

The above problem is solved by a method described herein. In particular, the invention provides a method for assembling a circuit board which has at least one layer copper clad on one or both sides or provided with conductor tracks, wherein in one assembly step, at least one rigid flange insert is inserted into an associated recess in the circuit board or in a semifinished circuit board part and wherein at least one semiconductor die of a semiconductor component is applied to the inserted flange insert in a subsequent application step. In one embodiment, the semifinished circuit board part is connected to the circuit board in the remainder after the assembly step and before the application step.

One factor is the fundamental consideration to equip the circuit board or a semifinished circuit board part initially with at least one flange insert and only then to apply at least one semiconductor die to the flange insert used.

In detail, it is proposed that in one assembly step, at least one rigid flange insert is inserted into an associated recess in the circuit board or in a semifinished circuit board part and that in a subsequent application step, at least one semiconductor die of a semiconductor component is applied to the flange insert already inserted.

Naturally, this can be provided for an arbitrary number of flange inserts and semiconductor dies. For better clarity, however, only one flange insert and one semiconductor die will be mentioned in almost all cases in the text which follows. These statements then apply correspondingly to all other flange inserts and semiconductor dies.

Due to the fact that the semiconductor die is now applied on an insert, namely the flange insert, and optimum contact structure can be established between flange insert and semiconductor die by selecting a suitable insert. In detail, the flange insert can be optimally adapted with regard to its material properties to the material properties of the semiconductor die. This especially, relates to an adaptation with regard to the heat expansion coefficients of flange insert and semiconductor die.

In a sense of a simple performability of the assembly step, it is of significance to the solution according to the proposal that the rigid flange insert can be used as such. The flange insert is thus not a coating or the like.

As indicated above, the flange insert can also be inserted into an associated recess in a semifinished circuit board part. This semifinished circuit board part can be, for example, a baseplate of the circuit board of copper or the like which is a component of a heat sink in a manner still to be explained. In an especially preferred embodiment, the semifinished circuit board part is connected to the circuit board in the remainder only after the assembly step and before the application step. Assembling the circuit board in the above sense thus intervenes in the production process of the circuit board.

In one embodiment, the flange insert is allocated to a heat sink of the circuit board, the flange insert being brought into heat-conducting contact with a heat conducting section, on the flange side, of the heat sink. Due to the fact the flange insert can be inserted, the flange insert can be designed from an optimum compromise between good heat conduction and low temperature-related mechanical loading of the semiconductor die. In one particular embodiment, the flange insert is allocated to a heat sink of the circuit board and is brought into heat-conducting contact with a heat conducting section, on the flange side, of the heat sink. In one embodiment, before the assembly step, the heat conducting section on the flange side of the heat sink is inserted into a recess in the circuit board and, in the assembly step, the flange insert is inserted into a recess in the heat conducting section, on the flange side, or in the assembly step, the flange insert is inserted into a recess in the heat conducting section on the flange side of the heat sink and the heat conducting section on the flange side is inserted thereafter, together with the flange insert, into the associated recess in the circuit board.

According to another embodiment, the above design of the flange insert preferably leads to the thermal expansion coefficient of the flange insert being different from the thermal expansion coefficient of the heat conducting section on the flange side. In one embodiment, the thermal expansion coefficient of the flange insert is different from the thermal expansion coefficient of the heat conducting section on the flange side, preferably in that the thermal expansion coefficient of the flange insert is less than the thermal expansion coefficient of the heat conducting section on the flange side, further preferably in that the thermal expansion coefficient of the flange insert is less than 90% of the thermal expansion coefficient of the heat conducting section on the flange side.

In one embodiment, the thermal expansion coefficient of the flange insert gets very close to the thermal expansion coefficient of the semiconductor die which, in principle, leads to a reduction of temperature-related mechanical loadings of the semiconductor die. In a more particular embodiment, the flange insert has a thermal expansion coefficient, the deviation of which from the thermal expansion coefficient of the applied semiconductor die is less than 10%, preferably less than 5%, further preferably less than 2%.

In principle, the flange insert and the heat conducting section at the flange side can be bonded, soldered or the like into the respective recess. According to one embodiment, however, it is provided that the inserting is in each case based on a pressing-in for creating a press fit. This makes it possible to omit additional mounting measures for the flange insert and/or the heat conducting section on the flange side. In a more specific embodiment, inserting the flange insert and/or the heat conducting section on the flange side for generating a press fit is based on pressing in the flange insert and/or the heat conducting section on the flange side.

According to a further teaching, which is allotted its own significance, a circuit board having at least one, preferably rigid layer copper clad on one or both sides or provided with conductor tracks and comprising a heat sink for dissipating the heat generated by at least one semiconductor component is claimed.

In one embodiment, the invention provides a circuit board comprising at least one layer copper clad on one or both sides or provided with conductor tracks, and comprising a heat sink for dissipating the heat generated by at least one semiconductor component, wherein the heat sink has at least one heat conducting section having a recess and one rigid flange insert inserted into the recess, onto which insert at least one semiconductor die of a semiconductor component can be applied and wherein the thermal expansion coefficient of the flange insert is different from the thermal expansion coefficient of the associated heat conducting section on the flange side. In one embodiment, the thermal expansion coefficient of the flange insert is less than the thermal expansion coefficient of the heat conducting section on the flange side, preferably in that the thermal expansion coefficient of the flange insert is less than 90% of the thermal expansion coefficient of the heat conducting section on the flange side. In another embodiment, heat conducting section on the flange side is pressed into a recess in the circuit board in a press fit and/or in that the flange insert is pressed into a recess in the heat conducting section of the heat sink on the flange side in a press fit. In another embodiment, the heat conducting section on the flange side of the heat sink and/or the flange insert consists or consist of a metallic material. In one embodiment, the heat conducting section on the flange side of the heat sink is designed to be essentially plate-like, preferably in that the inserted flange insert does not protrude over the plate-like heat conducting section on the flange side. In one embodiment, the heat conducting section on the flange side has an essentially serrated or wavy outer contour and/or the recess allocated to the heat conducting section on the flange side in the circuit board has an essentially serrated or wavy inner contour. In one embodiment, the heat sink provides a baseplate of the circuit board and the recess for the flange insert and/or the recess for the heat conducting section on the flange side of the heat sink is or are provided in the baseplate. In another embodiment, the heat conducting section on the flange side is formed by the baseplate.

One factor according to the further teaching is the consideration that the heat sink has a recess for a rigid flange insert to which a semiconductor die can be applied in the above manner, wherein the thermal expansion coefficient of the flange insert is different from the thermal expansion coefficient of the heat conducting section on the flange side.

Due to the multi-part arrangement of the heat sink according to the proposal, especially due to the insertability of the flange insert, an optimum adaptation of the flange insert to the respective semiconductor die can be created as explained above.

According to a further teaching, which is also allotted independent significance, a heat sink is claimed for dissipating the heat generated by at least one semiconductor component of a circuit board. In one embodiment, the invention provides a heat sink for dissipating the heat generated by at least one semiconductor component, wherein the heat sink has at least one heat conducting section having a recess and one rigid flange insert inserted into the recess onto which insert at least one semiconductor die of the semiconductor component can be applied and wherein the thermal expansion coefficient of the flange insert is different from the thermal expansion coefficient of the associated heat conducting section on the flange side. In another embodiment, the thermal expansion coefficient of the flange insert is less than the thermal expansion coefficient of the heat conducting section on the flange side, preferably in that the thermal expansion coefficient of the flange insert is less than 90% of the thermal expansion coefficient of the heat conducting section on the flange side. In one embodiment, the flange insert is pressed into the recess in the heat conducting section on the flange side in a press fit. In one embodiment, the heat conducting section on the flange side is essentially designed to be plate-like, preferably in that the inserted flange insert does not protrude over the plate-like heat conducting section on the flange side. In one embodiment, the heat conducting section on the flange side has an essentially serrated or wavy outer contour.

BRIEF DESCRIPTION OF THE FIGURES

In the text which follows, the invention will be explained by means of a drawing representing only illustrative embodiments. In the drawings.

Figure 1:
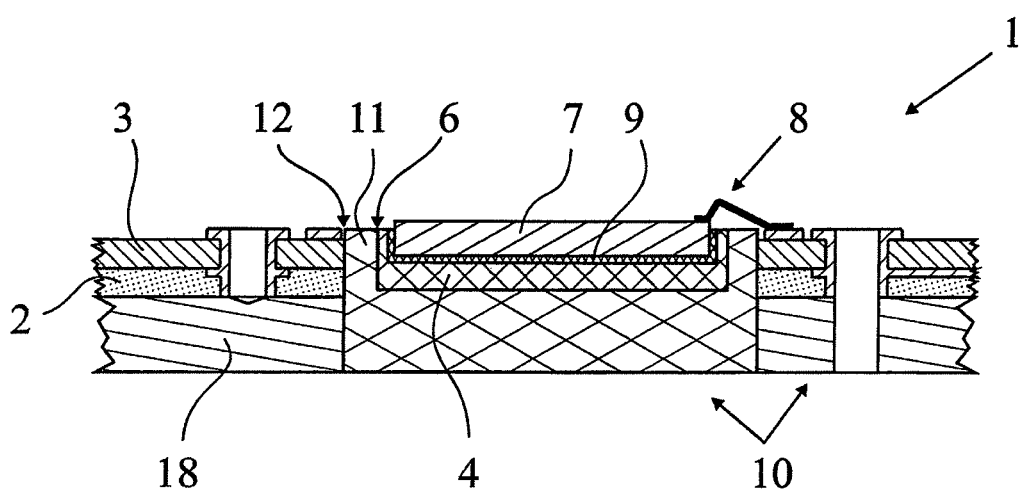
FIG. 1 shows a section of a circuit board according to a proposal in cross section.
Figure 2:
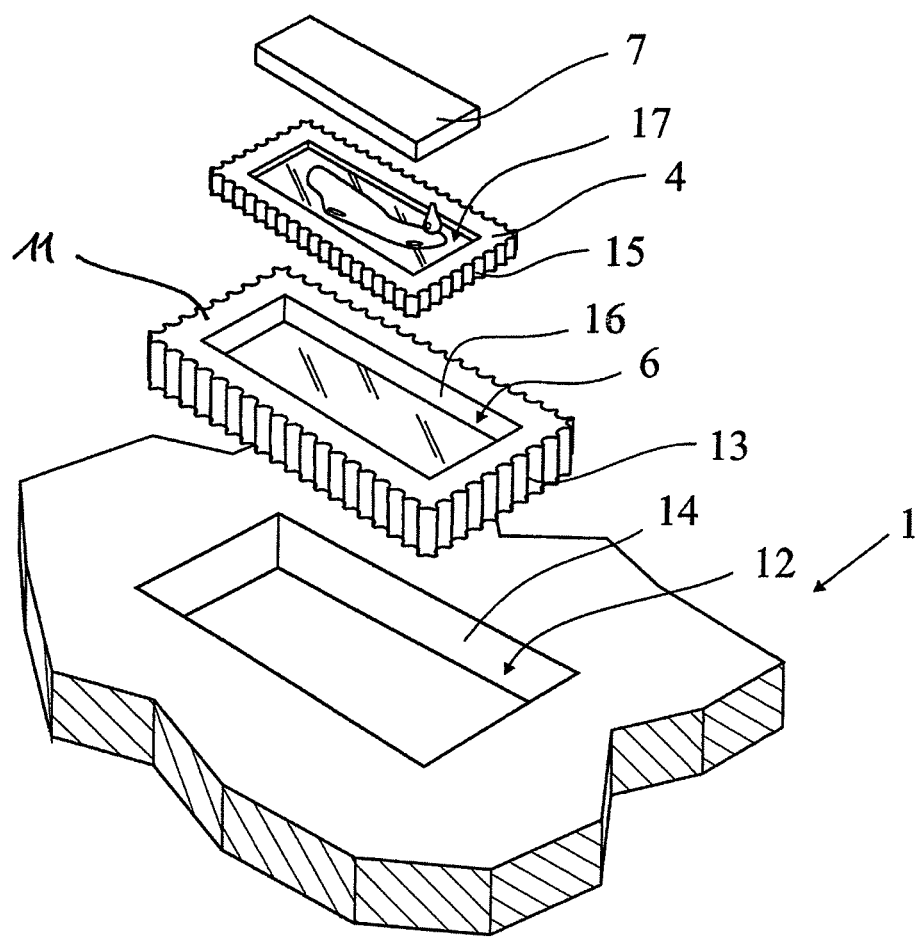
FIG. 2 shows a section of the circuit board according to FIG. 1 in a perspective exploded view.
Figure 3:
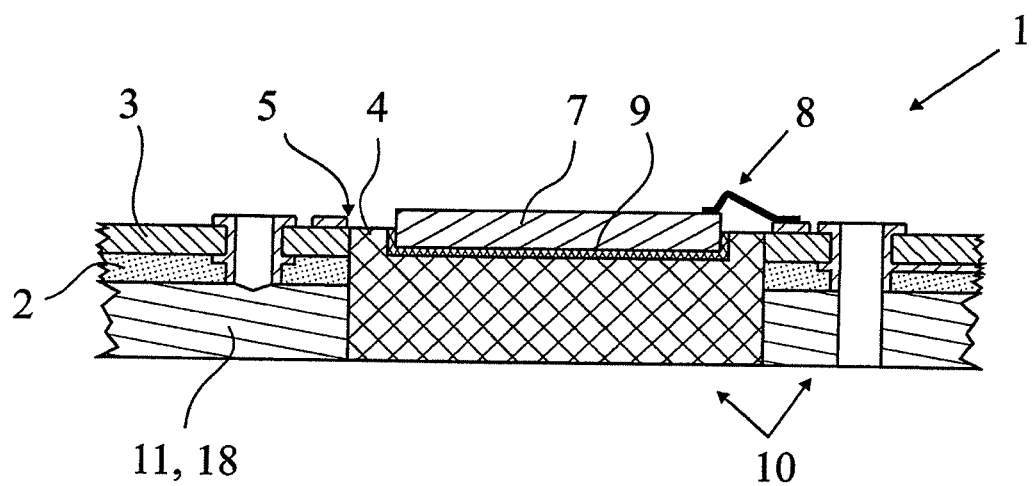
FIG. 3 shows a circuit board according to the proposal in cross section in a further embodiment.
Figure 4:
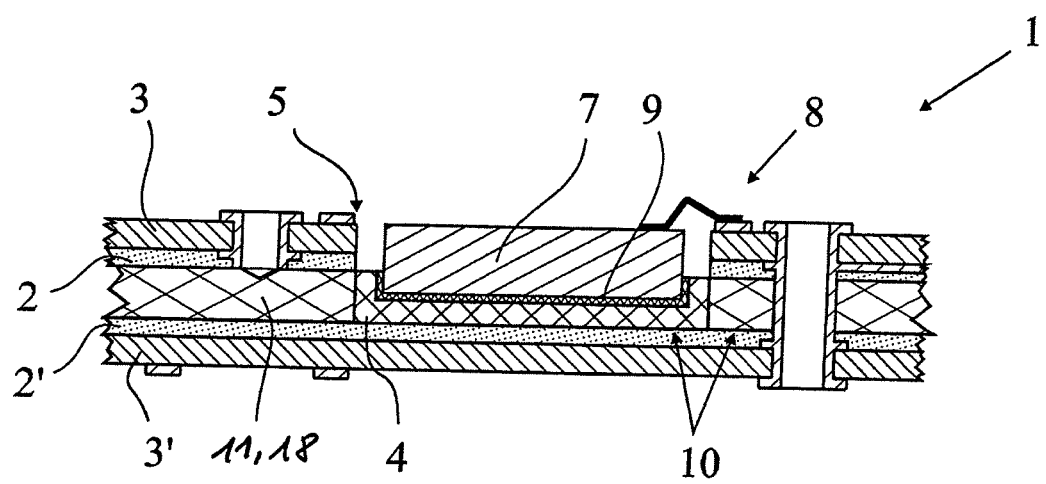
FIG. 4 shows a circuit board according to the proposal in cross section in a further embodiment.

The method according to the proposal is used for assembling a circuit board 1 which is shown in three embodiments in FIGS. 1 and 2, in FIG. 3 and in FIG. 4. The circuit board 1 can be largely designed arbitrarily, at least one rigid layer 2 copper clad on one or both sides or provided with conductor tracks being provided. In principle, the circuit board 1 can also be designed to be partially or even completely flexible. In the illustrative embodiments shown, the circuit board 1 is provided on the top with a copper layer 3 which is also to be understood to be non-restrictive.

FIGS. 1, 3 and 4 show the respective circuit board 1 in the assembled state. A rigid flange insert 4, which is inserted into an associated recess 5 in the circuit board 1 or into an associated recess 6 in a semifinished circuit board part 11, 18 associated with the circuit board 1, still to be explained. The flange insert 4 can be designed of one or more parts. A semiconductor die 7 of a semiconductor component 8 is applied to the flange insert 4.

It is important for the method as proposed that firstly, in one assembly step, the rigid flange insert 4 is inserted and that a semiconductor die 7 of a semiconductor component 8 is only applied to the inserted flange insert 4 in a subsequent application step.

The application step is followed by a bonding step in which the semiconductor die 7 is electrically contact-connected. The bonding step is of no further significance for the solution according to the proposal and will not be explained further, therefore.

In clarification, it may be pointed out that the term "semiconductor component" means the operational component which results from the applied and bonded semiconductor die 7.

The semiconductor die 7 is applied to the flange insert 4 preferably by means of a bonding layer 9 for the implementation of which numerous possibilities are known from the prior art.

In the case where the flange insert 4 is to be inserted into an associated recess in a semifinished circuit board part 11, 18 in the assembly step, it is preferably provided that the semifinished circuit board part 11, 18, after the assembly step and before the application step, is also connected to the circuit board 1. "Semifinished circuit board part" is understood to be any part of the circuit board 1 which is still to be connected to the circuit board 1. This can be, for example, a heat conducting section 11, still to be explained, on the flange side which itself may be insertable into a semifinished circuit board part, or a baseplate 18, also still to be explained, of the circuit board 1.

In both illustrative embodiments, shown in the drawing, the flange insert 4 is allocated to a heat sink 10 of the circuit board 1, the flange insert 4 being in heat-conducting contact with a heat conducting section 11 on the flange side. In this context, the heat conducting section 11 on the flange side itself can be designed as a rigid insert as is described in the text which follows.

In the embodiment shown in FIG. 1, two preferred assembly variants are obtained.

In a first assembly variant, the heat conducting section 11, on the flange side, of the heat sink 10 is inserted into a recess 12 in the circuit board 1 even before the assembly step, the flange insert 4 being inserted into a recess 6 in the heat conducting section 11 in the subsequent assembly step. In another preferred variant of the method, the flange insert 4 is inserted into a recess 6 in the heat conducting section 11, on the flange side, of the heat sink 10 during the assembly step, the heat conducting section 11 on the flange side being inserted thereafter, together with the flange insert 4, into the associated recess 12 in the circuit board 1. In a preferred variant, it is provided that, after the assembly step and before inserting the heat conducting section 11 on the flange side together with the flange insert 4 into the associated recess 12 in the circuit board 1, the application step is completed.

To clarify, it may be pointed out that the two assembly variants described above can also be applied, in principle, to a semifinished circuit board part which is still to be connected to the circuit board 1 for the remaining process.

The design of the material of the flange insert 4 is of special significance. It is of major importance here that the thermal expansion coefficient of the flange insert 4 is different from the thermal expansion coefficient of the heat conducting section 11 on the flange side so that a corresponding adaptation to the semiconductor die 7 is possible. This adaptation normally results in that the thermal expansion coefficient of the flange insert 4 is less than the thermal expansion coefficient of the heat conducting section 11 on the flange side. It is preferably such that the thermal expansion coefficient of the flange insert 4 is less than 90%, especially less than 80%, of the thermal expansion coefficient of the heat conducting section 11 on the flange side. The temperature-related expansion of the flange insert 4 is thus less than the temperature-related expansion of the heat conducting section 11 on the flange side.

The term "thermal expansion coefficient" in this case precisely relates to the thermal expansion which can be generated by a temperature-based mechanical loading between flange insert 4 and semiconductor die 7. When the semiconductor die 7 rests flat on the flange insert 4, the thermal expansion coefficient correspondingly relates to the thermal expansion along the contact area between flange insert 4 and semiconductor die 7.

In a particularly preferred embodiment, the thermal expansion coefficient of the flange insert 4 is designed for the thermal expansion coefficient of the semiconductor die 7 applied. The flange insert 4 then preferably has a thermal expansion coefficient, the deviation of which from the thermal expansion coefficient of the applied semiconductor die 7 is less than 10%, preferably less than 5%, further preferably less than 2%.

In principle, the flange insert 4 can be bonded, soldered or the like into the respective recess 5, 6. The same applies to the mounting of the heat conducting section 11 on the flange side into the associated recess 12. In this case, however, it is preferably such that the inserting of the flange insert 4 for generating a press fit is based on pressing the flange insert 4 into the respective recess 5, 6. As an alternative or additionally, there can be provided that the heat conducting section 11 on the flange side is pressed into the associated recess 12 for generating a press fit.

During the pressing-in of the flange insert 4 or of the heat conducting section 11 on the flange side, a mixture of non-positive locking and positive locking is preferably produced which, as a result, ensures firm seating of the flange insert 4 and of the heat conducting section 11 on the flange side.

In principle, other types of the mounting of the flange insert 4 or of the heat conducting section 11 on the flange side are also conceivable. The essential factor in all variants of mounting the flange insert 4 or of the heat conducting section 11 on the flange side is that thermal expansion of the heat conducting section 11 on the flange side is not transferred, or only to a slight extent, mechanically to the semiconductor die 7.

During the creation of a press fit for the flange insert 4 or for the heat conducting section 11 on the flange side, the mechanical stability of the relevant components is of special significance, wherein, at the same time, good thermal conductivity and, as far as the flange insert 4 is affected, a matching thermal expansion coefficient must not be left out of consideration. It has been found that good results can be achieved by the fact that the heat conducting section 11, on the flange side, of the heat sink 10 and/or the flange insert 4 consists of a metallic material. In this context, inexpensive copper, in particular, is available for the heat conducting section 10 on the flange side.

In the illustrative embodiment shown and preferred to this extent, the flange insert 4 and the heat conducting section 11 on the flange side are in each case designed to be one piece. This is again advantageous with regard to the creation of a press fit addressed above.

To clarify, it should be pointed out that the term "recess" can be understood to be a breakthrough or a tub-shaped recess. This relates both to recesses 5, 12 in circuit board 1 and recess 6 in the heat conducting section 11 on the flange side.

For the design of the heat conducting section 11 on the flange side, numerous structural variants are conceivable. Here, and preferably, the heat conducting section 11 on the flange side is essentially designed to be plate-like. In this context, the recess 6 in the heat conducting section 11 is essentially designed to be tub-like. This can be seen in the representation according to FIG. 2.

The representation according to FIG. 2 also shows that the heat conducting section 11 on the flange side has an essentially serrated outer contour 13 whilst the associated recess 12 in the circuit board 1 has an essentially smooth inner contour 14. However, it is also conceivable that the recess 12 has an also essentially serrated inner contour 14. Instead of the serrated contours, wavy contours can also be applied both in the outer contour 13 and in the inner contour 14.

The heat conducting section 11 on the flange side essentially corresponds to the known plate-like heat conducting sections which also have become known as press-fit coin.

Here, and preferably, the flange insert 4 is also designed to be essentially plate-like, the flange insert 4 again having an essentially serrated outer contour 15. The associated inner contour 16 is again designed to be straight. Here, too, it is conceivable that the inner contour 16 is designed to be serrated. Furthermore, it is conceivable that instead of a serrated contour, a wavy contour is used.

FIG. 2 finally shows that the flange insert 4 has at its top a tub-like recess 17 into which the semiconductor die 7 can be inserted.

The above serrated or wavy contours are particularly advantageous if a press fit of the relevant component is to be created.

In both variants of the embodiment shown in the drawing, the fact is of interest that the plate-like heat sink 10 provides a baseplate 18 of the circuit board 1 which here, and preferably, has a thickness of more than 0.5 mm. In a preferred embodiment, the baseplate 18 consists of copper.

The recess 5 for the flange insert 4 (FIG. 3) and/or the recess 12 for the heat conducting section 11 on the flange side of the heat sink 10 is provided here, and preferably, in the baseplate 18. In a particularly preferred embodiment, a press fit is provided here, as mentioned above, so that a good heat transition between the baseplate 18 and the heat conducting section 11 on the flange side is ensured. In the embodiment, shown in FIG. 3 and preferred to this extent, the heat conducting section 11 on the flange side is formed by the baseplate 18 so that the flange insert 4 is inserted directly into the recess 5 in the baseplate 18. Such a baseplate 18 can be a semifinished part, mentioned above, which is otherwise connected to the circuit board 1 only after the assembly step. In this context, the usual pressing processes are applied in which the individual layers 2 of the circuit board 1 are pressed together with a baseplate 18 preferably consisting of copper.

In a particularly preferred embodiment, it is thus, according to FIG. 4, that the inserted flange insert 4 does not protrude past the plate-like heating conducting section 11 on the flange side which in this case forms the above baseplate 18. This is advantageous in the above pressing together of the individual layers 2, 2' of the circuit board 1 with the semifinished part providing the baseplate 18. Thus, pressing together is also possible in such a manner that after the pressing together at least one layer 2, 2' of the circuit board 1 is or are arranged on both sides of the baseplate 18. In the case of the circuit board 1 shown in FIG. 4, the copper layer 3, 3' mentioned above is also provided on both sides of the baseplate 18.

In principle, it can be provided in this connection that the flange insert 4 ends flush with the baseplate 18 at least on one side which is also shown in FIG. 4.

According to further independent teachings, the circuit board 1 is claimed as such and the heat sink 10 is claimed as such. Reference may be made to all statements which are suitable for explaining the circuit board 1 and the heat sink 10.

As explained, by means of the teachings according to the proposal an optimum compromise can be achieved between good heat dissipation and low mechanical loading on the semiconductor die 7.

It should also be pointed out that the circuit board 1 according to the proposal can be equipped with a plurality of flange inserts 4 which preferably have different material parameters, especially with regard to their thermal expansion coefficients.

It is also conceivable that a heat sink 10 according to the proposal has several flange inserts 4 to which in each case a semiconductor die 7 of the respective semiconductor component can be applied. The semiconductor dies 7 existing on the heat sink 10 can be electrically contact-connected to one another so that the heat sink 10 as such already provides an electrical function module. The heat sink 10 can thus be inserted onto or into a higher-level circuit board 1.

With respect to all the above variants, it may be pointed out, to clarify, that a flange insert 4 does not necessarily accommodate precisely one semiconductor die 7. Instead, it is conceivable that a flange insert 4 carries a number of such semiconductor dies 7.

What is claimed is:

1. A method for assembling a circuit board which has at least one layer copper clad on one or both sides or provided with conductor tracks, wherein in one assembly step, at least one rigid flange insert is inserted into an associated recess in the circuit board or in a semifinished circuit board part and wherein at least one semiconductor die of a semiconductor component is applied to the inserted flange insert in a subsequent application step.

2. The method according to claim 1, wherein the semifinished circuit board part is connected to the circuit board in the remainder after the assembly step and before the application step.

3. The method according to claim 1, wherein the flange insert is allocated to a heat sink of the circuit board and is brought into heat-conducting contact with a heat conducting section on the flange side of the heat sink.

4. The method according to claim 3, wherein before the assembly step, the heat conducting section on the flange side of the heat sink is inserted into a recess in the circuit board and, in the assembly step, the flange insert is inserted into a recess in the heat conducting section on the flange side or in that in the assembly step the flange insert is inserted into a recess in the heat conducting section on the flange side of the heat sink and the heat conducting section on the flange side is inserted thereafter, together with the flange insert, into the associated recess in the circuit board.

5. The method according to claim 3, wherein the thermal expansion coefficient of the flange insert is different from the thermal expansion coefficient of the heat conducting section on the flange side.

6. The method according to claim 1, wherein the flange insert has a thermal expansion coefficient, the deviation of which from the thermal expansion coefficient of the applied semiconductor die is less than 10%.

7. The method according to claim 3, wherein inserting the flange insert, the heat conducting section on the flange side, or a combination thereof for generating a press fit is based on pressing in the flange insert, the heat conducting section on the flange side, or a combination thereof.

8. A circuit board comprising at least one layer copper clad on one or both sides or provided with conductor tracks, the circuit board comprising a heat sink for dissipating the heat generated by at least one semiconductor component, wherein the heat sink has at least one heat conducting section having a recess and one rigid flange insert inserted into the recess onto which insert at least one semiconductor die of a semiconductor component can be applied and wherein the thermal expansion coefficient of the flange insert is different from the thermal expansion coefficient of the associated heat conducting section on the flange side.

9. The circuit board according to claim 8, wherein the thermal expansion coefficient of the flange insert is less than the thermal expansion coefficient of the heat conducting section on the flange side.

10. The circuit board according to claim 8, wherein the heat conducting section on the flange side is pressed into a recess in the circuit board in a press fit, the flange insert is pressed into a recess in the heat conducting section of the heat sink on the flange side in a press fit, or a combination thereof.

11. The circuit board according to claim 8, wherein the heat conducting section on the flange side of the heat sink, the flange insert, or a combination thereof comprises a metallic material.

12. The circuit board according to claim 8, wherein the heat conducting section on the flange side of the heat sink is designed to be essentially plate-like.

13. The circuit board according to claim 8, wherein the heat conducting section on the flange side has an essentially serrated or wavy outer contour, the recess allocated to the heat conducting section on the flange side in the circuit board has an essentially serrated or wavy inner contour, or a combination thereof.

14. The circuit board according to claim 8, wherein the heat sink provides a baseplate of the circuit board and the recess for the flange insert, the recess for the heat conducting section on the flange side of the heat sink, or a combination thereof is or are provided in the baseplate.

15. The circuit board according to claim 8, wherein the heat conducting section on the flange side is formed by the baseplate.

16. A heat sink for dissipating heat generated by at least one semiconductor component, wherein the heat sink has at least one heat conducting section having a recess and one rigid flange insert inserted into the recess onto which insert at least one semiconductor die of the semiconductor component can be applied, wherein the thermal expansion coefficient of the flange insert is different from the thermal expansion coefficient of the associated heat conducting section on the flange side.

17. The heat sink according to claim 16, wherein the thermal expansion coefficient of the flange insert is less than the thermal expansion coefficient of the heat conducting section on the flange side.

18. The heat sink according to claim 16, wherein the flange insert is pressed into the recess in the heat conducting section on the flange side in a press fit.

19. The heat sink according to claim 16, wherein the heat conducting section on the flange side is essentially designed to be plate-like.

20. The heat sink according to claim 16, wherein the heat conducting section on the flange side has an essentially serrated or wavy outer contour.

* * * * *